(12) United States Patent
Xu et al.

(10) Patent No.: US 12,324,318 B2
(45) Date of Patent: Jun. 3, 2025

(54) DISPLAY PANEL AND DISPLAY DEVICE

(71) Applicant: Hefei Visionox Technology Co., Ltd., Anhui (CN)

(72) Inventors: Xiaowei Xu, Hefei (CN); Qiang Liu, Hefei (CN)

(73) Assignee: HEFEI VISIONOX TECHNOLOGY CO., LTD., Hefei (CN)

( * ) Notice: Subject to any disclaimer, the term of this patent is extended or adjusted under 35 U.S.C. 154(b) by 469 days.

(21) Appl. No.: 17/984,534

(22) Filed: Nov. 10, 2022

(65) Prior Publication Data

US 2023/0083099 A1 Mar. 16, 2023

Related U.S. Application Data

(63) Continuation of application No. PCT/CN2021/107718, filed on Jul. 21, 2021.

(30) Foreign Application Priority Data

Sep. 17, 2020 (CN) .......................... 202010983416.5

(51) Int. Cl.
*H10K 59/122* (2023.01)
*H10K 59/126* (2023.01)
(Continued)

(52) U.S. Cl.
CPC .......... *H10K 59/122* (2023.02); *H10K 59/126* (2023.02); *H10K 59/352* (2023.02); *H10K 59/65* (2023.02)

(58) Field of Classification Search
CPC .................................................. H10K 59/122
(Continued)

(56) References Cited

U.S. PATENT DOCUMENTS

2015/0076456 A1   3/2015  Choi et al.
2022/0013594 A1*  1/2022  Wang ................... H10K 50/824
(Continued)

FOREIGN PATENT DOCUMENTS

CN   110301053 A   10/2019
CN   110767694 A   2/2020
(Continued)

OTHER PUBLICATIONS

Office Action issued on Jan. 24, 2024, in corresponding Korean Application No. 10-2022-7040716, 19 pages.
(Continued)

*Primary Examiner* — Christopher M Raabe
(74) *Attorney, Agent, or Firm* — Maier & Maier, PLLC

(57) ABSTRACT

A display panel, a method for manufacturing a display panel, and a display device. The display panel includes: a substrate; and a pixel definition layer located on the substrate. The pixel definition layer includes isolation structures and pixel openings; and a nucleation inhibiting layer including first inhibiting units. A first orthographic projection of each of the first inhibiting units on the pixel definition layer covers corresponding one of the pixel openings in the transitional display area; and common electrodes including a first common electrode and a second common electrode, a second orthographic projection of the first common electrode on the pixel definition layer covers the first display area and at least part of an area except for the first orthographic projections in the transitional display area.

15 Claims, 6 Drawing Sheets

(51) Int. Cl.
*H10K 59/35* (2023.01)
*H10K 59/65* (2023.01)

(58) Field of Classification Search
USPC .......................................................... 313/500
See application file for complete search history.

(56) References Cited

U.S. PATENT DOCUMENTS

| | | | | |
|---|---|---|---|---|
| 2023/0083071 A1* | 3/2023 | Xu | ...................... | H10K 59/8052 |
| | | | | 257/89 |
| 2024/0237461 A1* | 7/2024 | Wang | .................... | H10K 59/352 |
| 2025/0031529 A1* | 1/2025 | Lim | ...................... | H10K 59/122 |

FOREIGN PATENT DOCUMENTS

| | | |
|---|---|---|
| CN | 110783484 A | 2/2020 |
| CN | 110867523 A | 3/2020 |
| CN | 210167360 U | 3/2020 |
| CN | 108496260 B | 5/2020 |
| CN | 111146363 A | 5/2020 |
| CN | 112103318 A | 12/2020 |
| KR | 1020150031100 A | 3/2015 |
| KR | 1020190014216 A | 2/2019 |
| KR | 20190086756 A | 7/2019 |
| WO | 2020133964 A1 | 7/2020 |

OTHER PUBLICATIONS

International Search Report, with accompanying Translation, issued on Oct. 20, 2021, in corresponding International Patent Application No. PCT/CN/2021/107718; 5 Pages.

Notice of Allowance issued on Oct. 4, 2024, in corresponding Korean Application No. 10-2022-7040716, 3 pages.

* cited by examiner

DISPLAY PANEL AND DISPLAY DEVICE

CROSS-REFERENCE TO RELATED APPLICATIONS

This application is a continuation of International Application No. PCT/CN2021/107718, filed on Jul. 21, 2021, which claims priority to Chinese Patent Application No. 202010983416.5, filed on Sep. 17, 2020, both of which are hereby incorporated by reference in their entireties.

TECHNICAL FIELD

The present application relates to field of display, in particular to a display panel and a display device.

BACKGROUND

With the rapid development of electronic devices, requirements of users on screen-to-body ratios become more and more higher and higher, so that full-screen displays of electronic devices are getting more and more attention of the industry.

Conventional electronic devices, such as cell phones and tablets, require integration of components such as front cameras, earphones, and infrared sensing elements. In the prior art, notches or holes may be provided on the display screens, so that external light can reach photosensitive elements under the screens through the notches or holes on the screens. However, these electronic devices are not literally full-screen devices. Not all areas across their entire screens can be used for display, for example, areas corresponding to their front cameras cannot be used for display.

SUMMARY

Embodiments of the present application provide a display panel and a display device. The display panel has at least an area that can be light-transmitting and used for display, thus facilitating under-screen integration of a photosensitive component.

Embodiments in a first aspect of the present application provide a display panel including a first display area, a second display area with a light transmittance less than a light transmittance of the first display area, and a transitional display area located between the first display area and the second display area, comprising: a substrate; a pixel definition layer located on the substrate, wherein the pixel definition layer comprises pixel openings and isolation structures formed around the pixel openings; a nucleation inhibiting layer located on a side of the pixel definition layer away from the substrate, wherein the nucleation inhibiting layer comprises first inhibiting units, and a first orthographic projection of each of the first inhibiting units on the pixel definition layer covers corresponding one of the pixel openings in the transitional display area; and common electrodes located on a side of the pixel definition layer away from the substrate, wherein the common electrodes comprise a first common electrode and a second common electrode formed in the second display area and the transitional display area, the second common electrode is located on a side of the first inhibiting units close to the pixel definition layer in the transitional display area, and a second orthographic projection of the first common electrode on the pixel definition layer covers the first display area and at least part of an area except for the first orthographic projections in the transitional display area.

Embodiments in a second aspect of the present application provide a method for manufacturing a display panel having a first display area, a second display area with a light transmittance less than a light transmittance of the first display area, and a transitional display area located between the first display area and the second display area, the method comprising:

forming a pixel definition material layer on a substrate and patterning the pixel definition material layer to form a pixel definition layer, wherein the pixel definition layer is arranged with pixel openings and isolation structures around the pixel openings;

forming a second common electrode on a side of the pixel definition layer away from the substrate in the second display area and the transitional display area;

arranging a mask on a side of the second common electrode away from the pixel definition layer, wherein the mask comprises first openings, each of which is overlapped with corresponding one of the pixel openings in the transitional display area;

forming a nucleation inhibiting layer using the mask, wherein the nucleation inhibiting layer comprises first inhibiting units which are formed on a side of the pixel definition layer away from the substrate through the first opening;

forming a first common electrode on a side of the pixel definition layer away from the substrate, wherein a second orthographic projection of the first common electrode on the pixel definition layer covers the first display area and at least part of an area except for the first orthographic projections in the transitional display area.

Embodiments in a third aspect of the present application further provide a display device, which includes the display panel of any one of the above embodiments.

According to an embodiment of the present application, in the display panel, the light transmittance of the first display area of the display panel is greater than the light transmittance of the second display area, so that a photosensitive component can be integrated on the backside of the first display area of the display panel, realizing the under-screen integration of a photosensitive component such as a camera, and at the same time, the first display area can display images, which increases a display area of the display panel and realizes a full-screen design of the display apparatus.

According to an embodiment of the present application, in the display panel, the second common electrode, but no first common electrode, is formed on the side of the pixel openings away from the substrate in the transitional display area. This can reduce display stripes formed by stacking of the first common electrode and the second common electrode in the pixel openings in the transitional display area, and further improve display effect of the display panel. Therefore, the display panel provided by embodiments of the present application can not only realize under-screen integration of photosensitive components, but also improve display effect of the display panel.

DETAILED DESCRIPTION

Features of various aspects and exemplary embodiments of the present application will be described in detail below. In order to make objects, technical solutions and advantages of the present application clearer, the present application is further described in detail below with reference to the drawings and specific embodiments. In electronic devices such as mobile phones or tablet computers, photosensitive elements such as a front camera, an infrared light sensor, and a proximity light sensor need to be integrated on the side on which a display panel is set. In some embodiments, a light-transmitting display area may be arranged on the above-described electronic devices and the photosensitive elements may be arranged on rear side of the light-transmitting display area so that a full-screen display of the electronic devices can be realized while ensuring that photosensitive elements work.

In order to increase a light transmittance of the light-transmitting display area, the light-transmitting display area and other display areas shall have cathodes of different materials. In molding process of a display panel, different processes are usually used to make cathodes of the light-transmitting display area and normal display area respectively, which results in that the cathode of a light-transmitting display area and the cathode of a normal display area may overlap at the connecting portion of the light-transmitting display area and the normal display area. The overlapped cathodes have a decreased light transmittance, leading to dark stripes on the display panel and affecting display effect of the display panel.

In order to solve the problem mentioned above, embodiments of the present application provide a display panel, a method for manufacturing a display panel and a display device. Embodiments of the display panel, the method for manufacturing the display panel, and the display device will be described below with reference to the drawings.

Embodiments of the present application provide a display panel which may be a display panel of organic light emitting diode (OLED).

Figure 1:
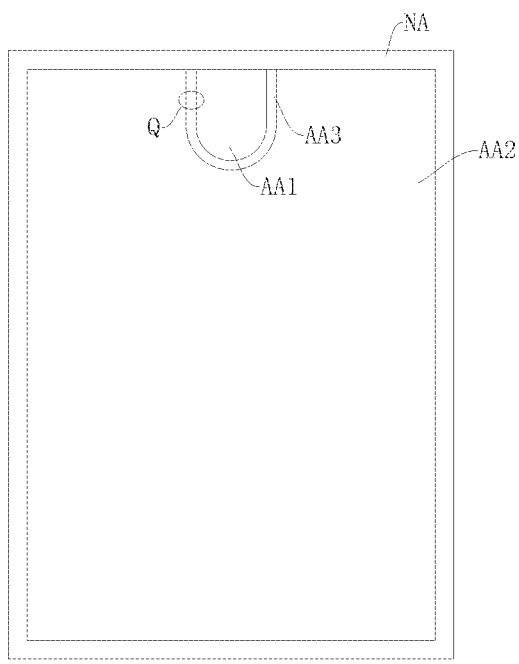
FIG. 1 is a top view of a display panel according to an embodiment of the present application.

With reference to FIG. 1, a display panel provided according to embodiments of the present application includes a first display area AA1, a second display area AA2 and a transitional display area AA3. A light transmittance of the first display area AA1 is greater than a light transmittance of the second display area AA2, that is, the first display area AA1 is a light-transmitting display area. The transitional display area AA3 is located between the first display area AA1 and the second display area AA2. There are various ways to set a light transmittance of the transitional display area AA3. The light transmittance of the transitional display area AA3 may be equal to the light transmittance of the first display area AA1, equal to the light transmittance of the second display area AA1, or equal to a value between the light transmittance of the first display area AA1 and the light transmittance of the second display area AA2.

In other embodiments, the display panel further includes a non-display area NA surrounding the first display area AA1, the second display area AA2 and the transitional display area AA3.

In embodiments of the present application, the light transmittance of the first display area AA1 is greater than or equal to 15%. In order to ensure that the light transmittance of the first display area AA1 is greater than 15%, greater than 40%, or even greater, a light transmittance of each functional film layer of the display panel in the embodiments is greater than 50%, or light transmittances of at least some of the functional film layers are even greater than 90%.

A light transmittance of the first display area AA1 is greater than a light transmittance of the second display area AA2 so that the display panel can have photosensitive elements integrated on the backside of the first display area, to achieve under-screen integration of photosensitive elements such as cameras while being able to display images on the first display area AA1. This increases display area of the display panel and realizes full-screen design of a display device.

Figure 2:
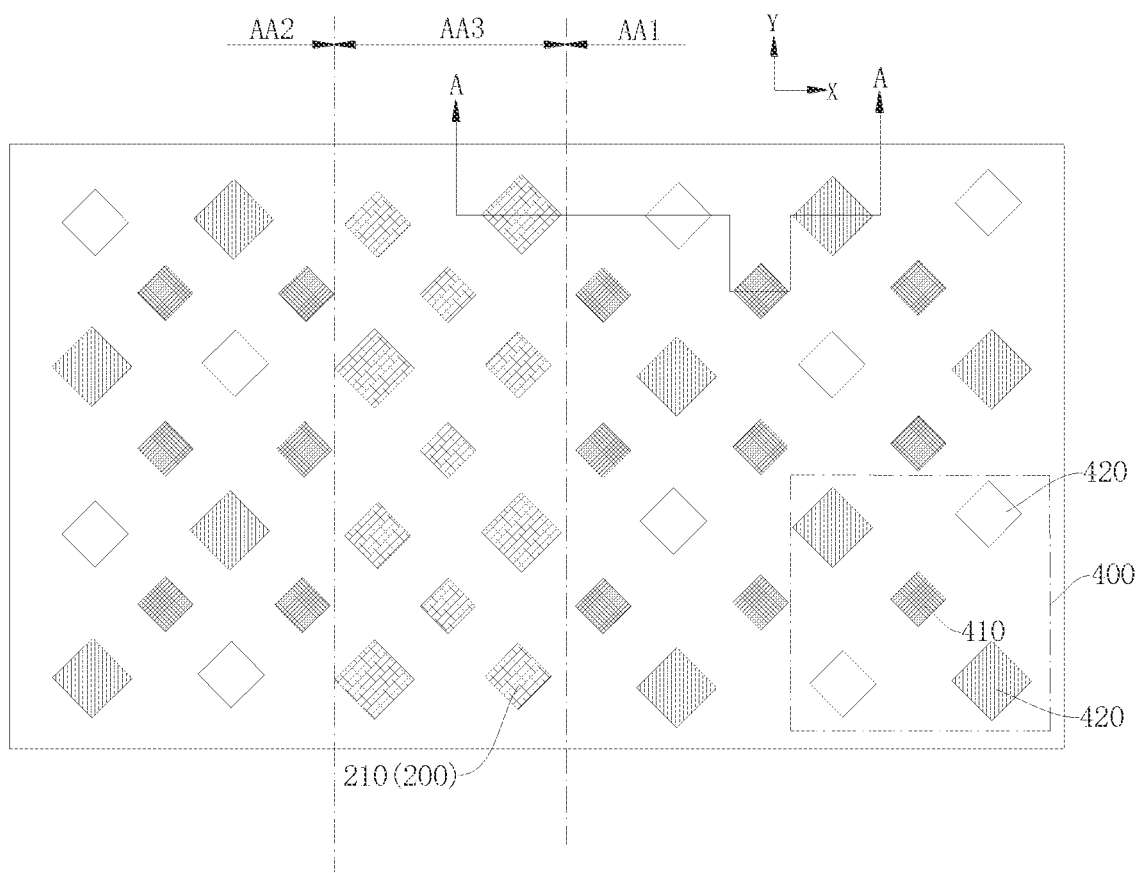
FIG. 2 illustrates a partial magnified view of area Q in FIG. 1 of an example.
Figure 3:
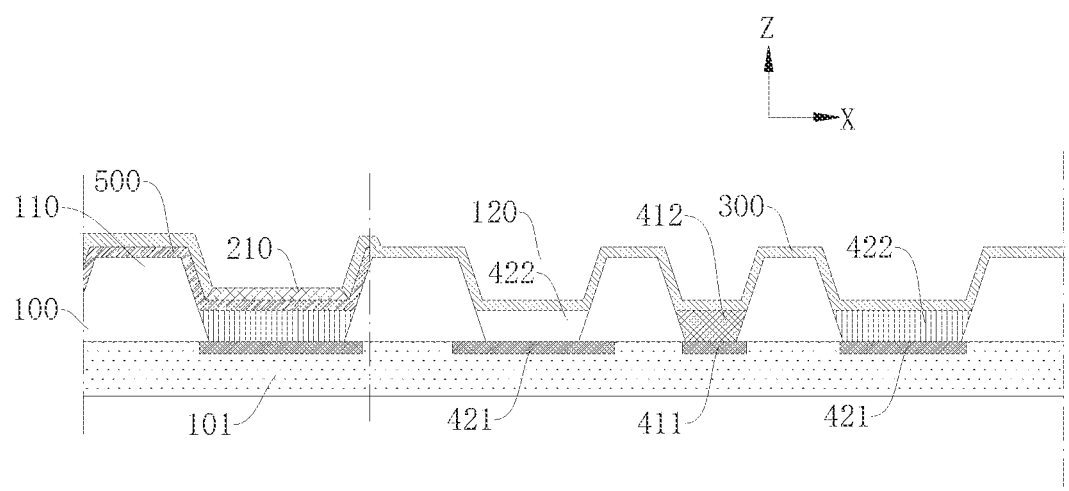
FIG. 3 is a cross-sectional view along A-A in FIG. 2.

As illustrated in FIG. 2 and FIG. 3, according to embodiments of the present application, the display panel comprises: a substrate 101; a pixel definition layer 100, which is located on the substrate 101 and includes isolation structures 110 and pixel openings 120 enclosed by the isolation structures 110; a nucleation inhibiting layer 200, which is located on a side of the pixel definition layer 100 away from the substrate 101 and includes first inhibiting units 210, wherein first orthographic projections of the first inhibiting units 210 on the pixel definition layer 100 cover the pixel openings 120 in the transitional display area AA3; common electrodes, which are located on a side of the pixel definition layer 100 away from the substrate 101 and include a first common electrode 300 and a second common electrode 500, wherein the second common electrode 500 is formed in the second display area AA2 and the transitional display area AA3, and in the transitional display area AA3, the second common electrode 500 is located on a side of the first inhibiting units 210 close to the pixel definition layer 100, a second orthographic projection of the first common electrode 300 on the pixel definition layer 100 covers the first display area AA1 and at least part of area except for the first orthographic projections in the transitional display area AA3.

The nucleation inhibiting layer 200 is located on a side of the pixel definition layer 100 away from the substrate 101. The nucleation inhibiting layer 200 may be in direct contact with the pixel definition layer 100, or other layer structures may be arranged between the nucleation inhibiting layer 200 and the pixel definition layers 100. For example, structures such as a carrier layer are arranged between the nucleation inhibiting layer 200 and the pixel definition layer 100. Herein, the carrier layer refers to a carrier-related film layer used to realize functions of injection, transport, blocking of carriers (holes or electrons). In some embodiments, the carrier layer may include at least one of a hole inject layer (HIL), a hole transport layer (HTL), an electron blocking layer (EBL), an electron inject layer (EIL), an electron transport layer (ETL), and a hole blocking layer (HBL).

The common electrodes are located on a side of the pixel definition layer 100 away from the substrate 101. The common electrodes may directly contact the isolation structures of the pixel definition layer 100, or other layer structures, such as the carrier layer mentioned above, may be arranged between the common electrodes and the pixel definition layer 100. But it can be understood that the common electrodes are arranged on a side of the light-emitting layer away from the substrate 101. The pixel electrodes, the light-emitting layer and the common electrodes form a light-emitting device to realize a light-emitting function.

The display panel according to an embodiment of the present application includes the substrate 101, the pixel definition layer 100, the nucleation inhibiting layers 200 and the common electrodes. The first orthographic projection of one of the first inhibiting units 210 on the pixel definition layer 100 covers corresponding one of the pixel openings 120 in the transitional display area AA3, that is, the first inhibiting units 210 are formed on a side of the pixel openings 120 away from the substrate 101 in the transitional display area AA3. The second orthographic projection of the first common electrode 300 on the pixel definition layer 100 covers the first display area AA1 and area except for the first orthographic projections in the transitional display area AA3, that is, the first common electrode 300 is not formed on a side of pixel openings 120 away from the substrate 101 in the transitional display area AA3. The second common electrode 500 is formed in the second display area AA2 and the transitional display area AA3. Therefore, the second common electrode 500 is formed in the pixel openings 120 in the transitional display area AA3. The second common electrode 500, but no first common electrode 300, is formed on the side of the pixel openings 120 away from the substrate 101 in the transitional display area AA3. This can reduce display stripes formed by stacking of the first common electrode 300 and the second common electrode 500 in the pixel openings 120 in the transitional display area AA3, and further improve display effect of the display panel. Therefore, the display panel provided by embodiments of the present application can not only realize under-screen integration of photosensitive components, but also improve display effect of the display panel.

Various materials can be chosen for the first common electrode 300 and the second common electrode 500. In some optional embodiments, the first common electrode 300 is different material from the second common electrode 500. Light transmittance of the first common electrode 300 is higher than light transmittance of the second common electrodes 500. This can further improves light transmittance of the first display area AA1.

Material of the first common electrode 300 includes magnesium, and the weight ratio of magnesium is higher than or equal to 95%. Proportion of magnesium in material of the first common electrode 300 is relatively high, which can improve light transmittance of the first common electrode 300.

The second common electrode 500 includes a magnesium-silver alloy layer. The magnesium-silver alloy layer has good electrical conductivity and can improve viewing angle dependence and display uniformity of the second display area AA2.

In the magnesium-silver alloy layer, the weight ratio of magnesium to silver ranges from 1/15 to 1/9.

Figure 4:
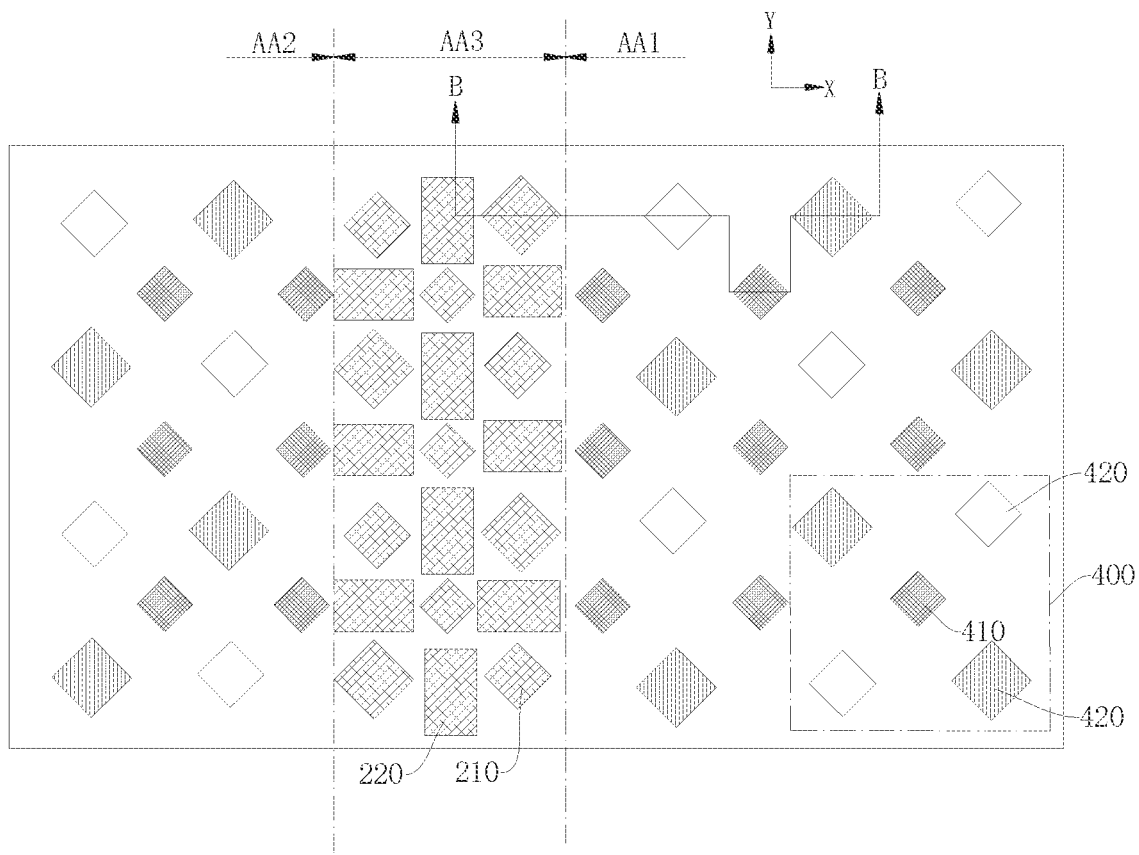
FIG. 4 illustrates a partial magnified view of area Q in FIG. 1 of another example.
Figure 5:
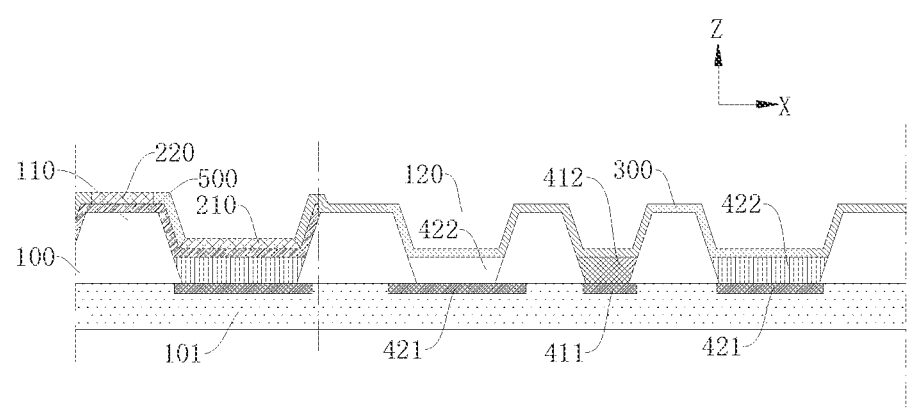
FIG. 5 is a cross-sectional view along B-B in FIG. 4.

As illustrated in FIG. 4 and FIG. 5, the nucleation inhibiting layer 200 further includes second inhibiting units 220. Third orthographic projection of one of the second inhibiting units 220 on the pixel definition layer 100 covers at least part of one of the isolation structures 110 in the transitional display area AA3. The second orthographic projection covers at least part of area except for the first orthographic projections and the third orthographic projections on the pixel definition layer 100.

The second inhibiting units 220 are arranged accordingly on the isolation structures 110 in the transition display area AA3. The second orthographic projection covers at least part of area except for the first orthographic projections and the third orthographic projections on the pixel definition layer 100. This reduces distribution area of the first common electrode 300 in the transitional display area AA3 to increase light transmittance of the transitional display area AA3 and reduce display stripes between the first display area AA1 and the second display area AA2, improving display effect of the display panel.

At least part of the first common electrode 300 and part of the second common electrode 500 are stacked in the transitional display area AA3, so that the first common electrode 300 is electrically connected to the second common electrode 500. In the transitional display area AA3, the first common electrode 300 is located on a side of the second common electrode 500 away from the pixel definition layer 100. That is, the second common electrode 500 is arranged close to the pixel openings 120. The second common electrode 500 is used to power the light-emitting structures in the transitional display area AA3 so that the transitional display area AA3 can display images. The second common electrode 500 is usually good conductive, and can improve display effect of the transitional display area AA3.

In the transitional display area AA3, the first inhibiting units 210 and the second common electrode 500 are stacked, and the second common electrode 500 is located on a side of the first inhibiting units 210 close to the pixel definition layer 100. In the molding process of the display panel, the second common electrode 500 is first formed on a side of the pixel definition layer 100 away from the substrate 101, and then the first inhibiting unit 210 is formed on the second common electrode 500 to avoid the first inhibiting unit 210 affecting the shaping of the second common electrode 500.

In the transitional display area AA3, at least part of the first inhibiting units 220 and at least part of the second common electrode 500 are stacked. The second common electrode 500 is located on a side of the second inhibiting units 220 close to the pixel definition layer 100. In the molding process of the display panel, the second common electrode 500 is first formed on a side of the pixel definition layer 100 away from the substrate 101, and then the second inhibiting unit 220 is formed on the second common electrode 500 to avoid the second inhibiting unit 220 affecting the shaping of the second common electrode 500.

Figure 6:
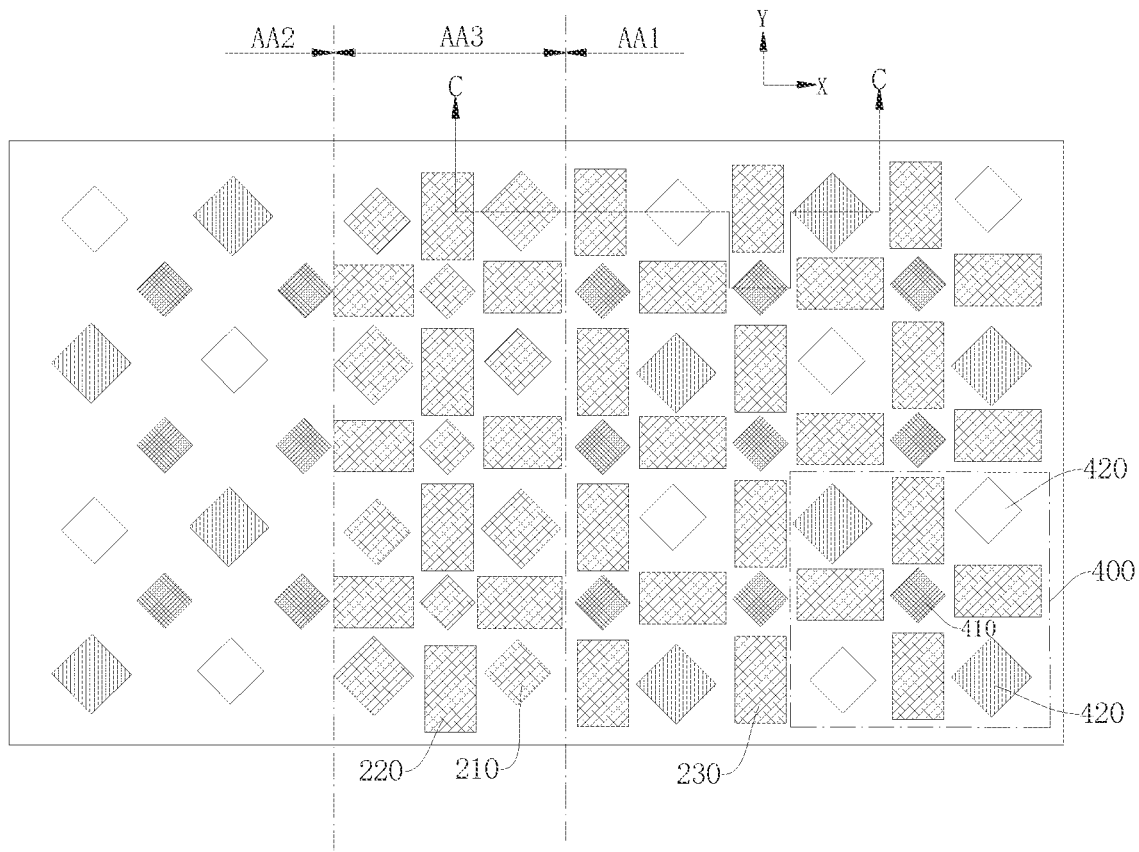
FIG. 6 illustrates a partial magnified view of area Q in FIG. 1 of additional example.
Figure 7:
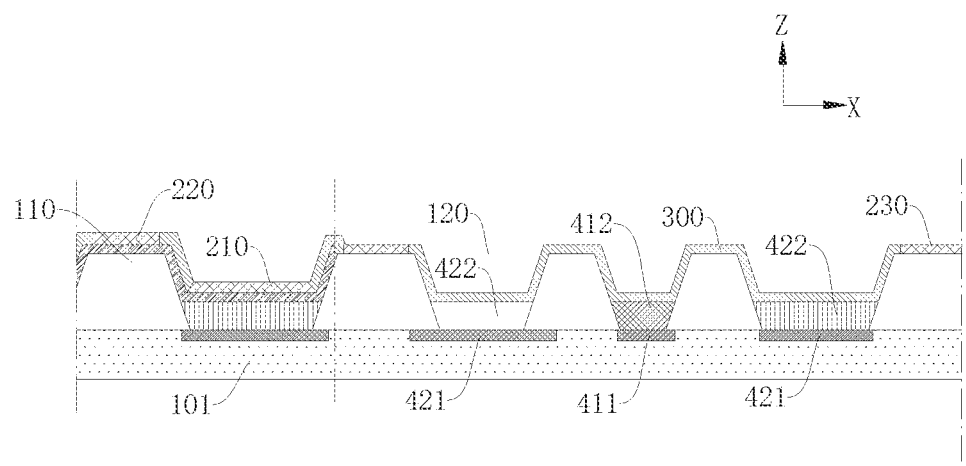
FIG. 7 is a cross-sectional view along C-C in FIG. 6.

As illustrated in FIG. 6 and FIG. 7, in some optional embodiments, the nucleation inhibiting layer 200 further includes third inhibiting units 230. Fourth orthographic projection of corresponding third inhibiting unit 230 of the third inhibiting units 230 on the pixel definition layer 100 covers at least part of corresponding one of the isolation structures 110 in the first display area AA1. In an example, fourth orthographic projection of each of the third inhibiting units 230 on the pixel definition layer 100 covers at least part of corresponding one of the isolation structures 110 in the first display area AA1. Some of the third inhibiting units 230 are arranged discontinuously with each other. In the first display area AA1, the second orthographic projection covers at least part of area except for the fourth orthographic projections on the pixel definition layer 100.

In the first display area AA1, fourth orthographic projections cover at least part of the isolation structures 110 in the first display area AA1. That is, the third inhibiting units 230 are correspondingly arranged on a side of at least part of the isolation structures 110 away from the substrate 101. The second orthographic projection covers at least part of area except for the fourth orthographic projections on the pixel definition layer 100. Thus, the first common electrode 300 is not arranged on side of at least part of the isolation structures 110 away from the substrate 101. This can reduce distribution area of the first common electrode 300 in the first display area AA1. A small size of distribution area of the first common electrode 300 can increase light transmittance of the first display area AA1. The third inhibiting units 230 are not arranged in the pixel openings 120. Arrangement of the first common electrode 300 in the pixel openings 120 does not affect normal display in the first display area AA1.

Figure 8:
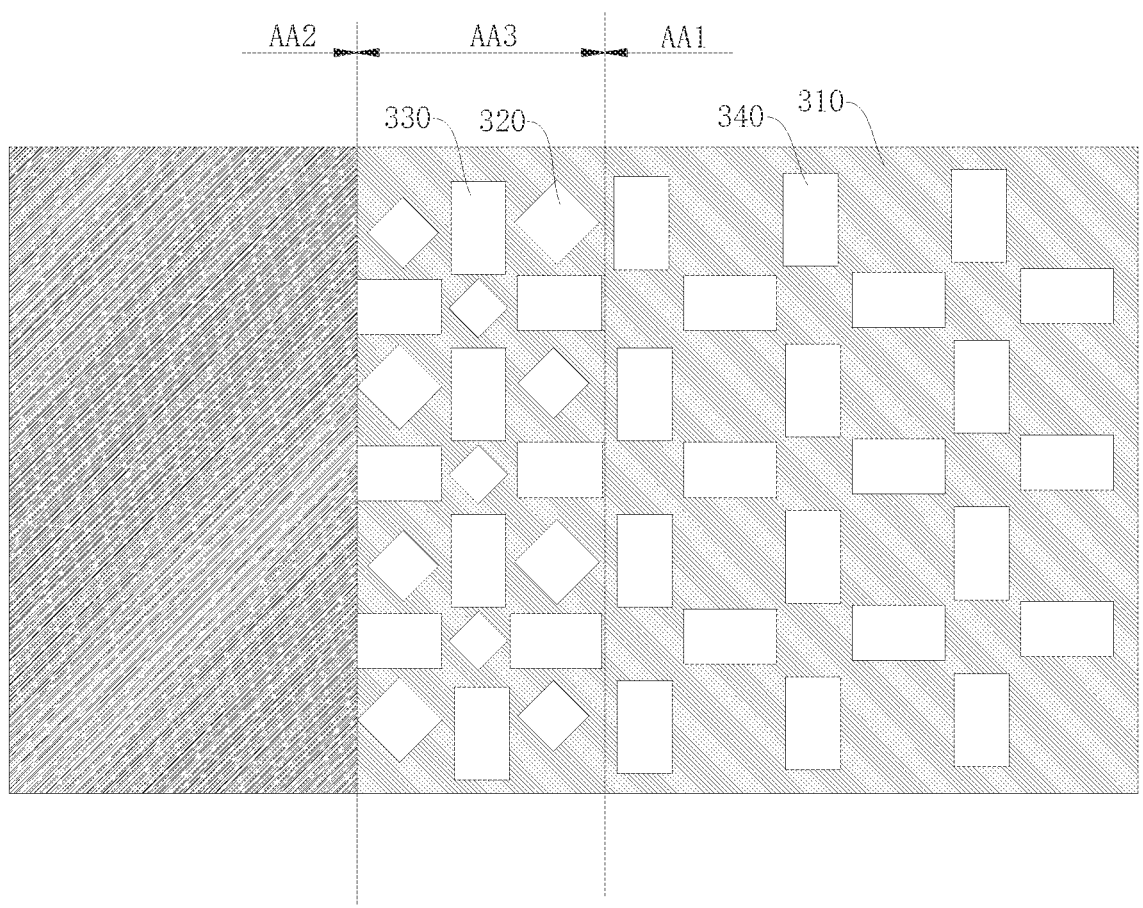
FIG. 8 illustrates a structural diagram of common electrodes of a display panel provided by an embodiment of the present application.

As illustrated in FIG. 8, the first common electrode 300 includes a body 310 and first hollows 320 through the body part 310. The first hollows 320 are formed in the transitional display area AA3. The first hollows 320 are overlapped with at least part of pixel openings 120 in the thickness direction of the display panel, and the first inhibiting units 210 are located in the first hollows 320.

A plurality of the first hollows 320 are spaced in arrangement and the body 310 of the first common electrode 300 forms a continuous whole layer via parts between two adjacent hollows 320. First hollows 320 are arranged in the first common electrode 300 and the first inhibiting units 210 are arranged in the first hollows 320. This can reduce area of the first common electrode 300 to increase light transmittance in the transitional display area AA3 of the display panel.

Optionally, the first common electrode 300 further includes second hollows 330 through the body 310. The second inhibiting units 220 are located in the second hollows 330. Optionally, the first common electrode 300 further includes third hollows 340 through the body 310. The third inhibiting units 230 are located in the third hollows 340. This can increase light transmittance in the first display area AA1 of the display panel.

In some optional embodiments, the minimum width of the transitional display area AA3 ranges from 10 μm to 100 μm. In the case that the minimum width of the transitional display area AA3 is within the above range, the transitional display area AA3 is not too small so that display stripes between the first display area AA1 and the second display area AA2 can be reduced, and the transitional display area AA3 is not too large so as to affect display effect of the display panel.

The nucleation inhibiting layer 200 may be an optical external coupling coating layer. The nucleation inhibiting layer 200 can be selectively deposited on the isolation structures 110, the second common electrode 500 or the carrier layer by evaporation (including thermal evaporation and electron beam evaporation), photo lithography, printing etc.

Material of the nucleation inhibiting layer 200 includes small molecular organic compounds, polymers, organometallic compounds and/or inorganic compounds and elements. The nucleation inhibiting layer 200 makes certain materials such as magnesium not likely to be deposited on its surface. For example, when the material of the nucleation inhibiting layer 200 includes organic material, magnesium is not likely to be deposited on the surface of the nucleation inhibiting layer 200. The material of the first common electrode 300 includes, for example, magnesium, and the nucleation inhibiting layer 200 is configured to inhibit the first common electrode 300 from being formed on the surface of the nucleation inhibiting layer 200. That is, the first common electrode 300 is inhibited from being formed on the inhibiting unit 210 so that the first common electrode 300 is not formed on the surface of the inhibiting unit 210 away from the isolation structure 110. After the nucleation inhibiting layer 200 is formed on the isolation structures 110 and when the first common electrode 300 is being formed on the pixel definition layer 100, the first common electrodes 300 will not be formed on the first inhibiting units 210. Thus, the first common electrode 300 is not formed on a side of the pixel openings 120 away from the substrate 101 in the transitional display area AA3.

Thickness of the nucleation inhibiting layer 200 ranges from 10 Å to 100 Å. In a case that thickness of the nucleation inhibiting layer 200 is within the range above, it can be guaranteed that surface of the nucleation inhibiting layer 200 s sufficiently small adhesion. Given this, the first common electrode 300 is not formed on the surface of the inhibiting units, and it can be avoided that the inhibiting units spread to undesired areas to expand coverage areas of the inhibiting units due to over thick nucleation inhibiting layer 200.

The third inhibiting units 230 are not limited in size as long as fourth orthographic projection of each of the third inhibiting units 230 can cover corresponding one of the isolation structures 110 while does not cover the corresponding pixel opening 120 and do not affect forming of the first common electrode 300 on a side of the pixel openings 120 away from the substrate 101. The minimum width of the third inhibiting unit 230 may be wider than or equal to 5 μm. The third inhibiting units 230 are relatively large in size. This can increase light transmittance in the first display area AA1.

The minimum distance between a third inhibiting unit 230 and a pixel opening 120 can be greater than or equal to 10 μm. The minimum distance between a third inhibiting unit 230 and a pixel opening 120 within the range above can prevent the inhibiting units from spreading to the pixel openings 120, so that the first common electrode 300 will not be formed on the pixel openings 120 to affect display.

The first display area AA1 is provided with first pixel groups 400. The first pixel group 400 includes a first-type sub-pixel 410 and second-type sub-pixels 420. A plurality of second-type sub-pixels 420 are distributed along the periphery of the first-type sub-pixel 410. The third inhibiting unit 230 is located on the periphery of the first-type sub-pixel 410, and the third inhibiting unit 230 is located between two adjacent second-type sub-pixels 420.

Distribution of the third inhibiting units 230 is relatively sparse and can increase light transmittance in the first display area AA1 and discharge capacity of the first common electrode 300.

A plurality of second-type sub-pixels 420 are evenly distributed along the periphery of a first-type sub-pixel 410. The third inhibiting units 230 are evenly located on the periphery of the first-type sub-pixel 410. This can improve display effect.

Four second-type sub-pixels 420 are arranged along the periphery of a first-type sub-pixel 410, and they are evenly distributed around the periphery of the first-type sub-pixel 410.

The first-type sub-pixels 410 are green sub-pixels, and the second-type sub-pixels 420 include red sub-pixels and blue sub-pixels.

With reference to FIG. 2, the plurality of first pixel groups 400 in the first display area AA1 are distributed in an array along a first direction (X direction in FIG. 2) and a second direction (Y direction in FIG. 2). A first-type sub-pixel 410 is arranged between two adjacent second-type sub-pixels 420 in the first direction, and a first-type sub-pixel 410 is arranged between two adjacent second-type sub-pixels 420 in the second direction. A plurality of first-type sub-pixels 410 are distributed in an array along the first direction and the second direction in the first display area AA1. In both the first and second direction, red sub-pixels and blue sub-pixels are distributed alternatively.

With further reference to FIG. 2, the display panel includes red sub-pixels, blue sub-pixels and green sub-pixels. A plurality of second-type sub-pixels 420 are distributed in an array along the first direction and the second direction. That is, in either of the first and second direction, the red sub-pixels and blue sub-pixels are on the same line and arranged alternatively. The first-type sub-pixels 410 arranged in sequence in the first direction are located between two adjacent rows of second-type sub-pixels 420. That is, green sub-pixels are located between a row of red sub-pixels and an adjacent row of blue sub-pixels. The first-type sub-pixels 410 arranged in sequence in the second direction are located between two adjacent rows of second-type sub-pixels 420. That is, green sub-pixels are located between two adjacent rows of red sub-pixels and blue sub-pixels. In the first display area AA1, an inhibiting unit is arranged between two adjacent second-type sub-pixels 420. That is, an inhibiting unit is arranged between a red sub-pixel and an adjacent blue sub-pixel in the first direction, and an inhibiting unit is arranged between a red sub-pixel and an adjacent blue sub-pixel in the second direction.

In a first pixel group 400, a first-type sub-pixel 410 may be smaller than a second-type sub-pixel 420 in size, and a plurality of second-type sub-pixels 420 may be the same or different in size.

In some embodiments, first pixel circuits are also arranged in the first display area AA1. The first pixel circuits are electrically connected to the first-type sub-pixels 410 or the second-type sub-pixels 420 to drive the first-type sub-pixels 410 or the second-type sub-pixel 420. The first pixel circuits may be located in the transitional display area AA3 or the second display area AA2 to increase light transmittance of the first display area AA1. The number of the first pixel circuits may be plural, and they are electrically connected to corresponding first-type sub-pixels 410 and second-type sub-pixels 420 respectively.

Circuit structure of the first pixel circuits may be any one of 2T1C circuit, 7T1C circuit, 7T2C circuit or 9T1C circuit.

The display panel may further include second pixel circuits and third pixel circuits. The second pixel circuits are located in the second display area AA2, and the third pixel circuits are located in the transitional display area AA3. The second pixel circuits are electrically connected to the sub-pixels in the second display area AA2 for driving the sub-pixels in the second display area AA2 to display. The third pixel circuits are electrically connected to sub-pixels in the transitional display area AA3, and drive the sub-pixels in the transitional display area AA3. Circuit structures of the second pixel circuits and the third pixel circuits may be any one of a 2T1C circuit, a 7T1C circuit, a 7T2C circuit or a 9T1C circuit, respectively.

In some embodiments, the display panel further includes the substrate 101 and a device layer. The device layer is located on the substrate 101, and the first pixel circuits are located in the device layer. The pixel definition layer 100 is located on the device layer.

The substrate 101 may be made of light-transmitting materials such as glass or polyimide (PI). The device layer may include the pixel circuits for driving respective sub-pixels to display.

The pixel openings 120 of the pixel definition layer 100 include first pixel openings and second pixel openings in the first display area AA1. The pixel openings 120 may further include third pixel openings in the second display area AA2 and fourth pixel openings in the third display area AA3.

The first-type sub-pixel 410 include a first light-emitting structure 412 and a first pixel electrode 411. The first light-emitting structure 412 is in the first pixel opening, and is located on a side of the first common electrode 300 close to the substrate 101. The first pixel electrode 411 is located on a side of the first light-emitting structure 412 close to the substrate 101. The second type of sub-pixel 420 includes a second light-emitting structure 422 and a second pixel electrode 421. The second light-emitting structure 422 is in the second pixel opening, and located on a side of the first common electrode 300 close to the substrate 101. The second pixel electrode 421 is located on a side of second light-emitting structure 422 close to the substrate 101.

The first light-emitting structure 412 is arranged between the first pixel electrode 411 and the first common electrode 300. When the first pixel electrode 411 and the common electrode are connected to the power supply, the first light-emitting structure 412 can be driven to emit light. Similarly, the second light-emitting structure 422 is arranged between the second pixel electrode 421 and the first common electrode 300. The second pixel electrode 421 and the first common electrode 300 can be used to drive the second light-emitting structure 422 to emit light. The third inhibiting units 230 are located on the isolation structures 110. The first common electrode 300 is not arranged on part of surface of the isolation structures 110, and will not affect light emitting of the first light-emitting structures 412 and the second light-emitting structures 422.

The first light-emitting structures 412 and second light-emitting structures 422 can include OLED light-emitting layer, respectively. Based on design requirements, the first light-emitting structures 412 and the second light-emitting structures 422 can further includes at least one of a hole injection layer, a hole transport layer, an electron injection layer or an electron transport layer, respectively.

The first pixel electrodes 411 and the second pixel electrodes 421 may be light-transmitting electrodes. The first pixel electrodes 411 and the second pixel electrodes 421 may include an indium tin oxide (ITO) layer or an indium zinc oxide layer. The first pixel electrodes 411 and the second pixel electrodes 421 may also be reflective electrodes, including a first light-transmitting conductive layer, a reflective layer on the first light-transmitting conductive layer and a second light-transmitting conductive layer on the reflective layer. The first light-transmitting conductive layer and the second light-transmitting conductive layer may be ITO or indium zinc oxide, and the reflective layer may be a metal layer, for example, made of silver. The second pixel electrode 421 may be configured to use the same material as the first pixel electrode 411.

Orthographic projection of each first light-emitting structure 412 on the substrate 101 is one first pattern element or is composed of two or more first pattern elements. The first pattern element includes at least one selected from a circle, an ellipse, a dumbbell, a gourd and a rectangle.

Orthographic projection of each first pixel electrode 411 on the substrate 101 is one second pattern element or is composed of two or more second pattern elements. The second pattern element includes at least one selected from a circle, an ellipse, a dumbbell, a gourd and a rectangle.

Orthographic projection of each second light-emitting structure 422 on the substrate 101 is one third pattern element or is composed of two or more third pattern elements. The third pattern element includes at least one selected from a circle, an ellipse, a dumbbell, a gourd and a rectangle.

Orthographic projection of each second pixel electrode 421 on the substrate 101 is one fourth pattern element or is composed of two or more fourth pattern elements. The fourth pattern element includes at least one selected from a circle, an ellipse, a dumbbell, a gourd and a rectangle.

The display panel further includes an encapsulation layer, a polarizer and a cover plate on the encapsulation layer. A cover plate can be directly disposed on a encapsulation layer without a polarizer, or a cover plate can be directly disposed on a encapsulation layer without a polarizer in at least the first display area so as to avoid polarizer's affection on light collection amount of the photosensitive elements deposited under the corresponding first display area. Of course, a polarizer can be disposed on an encapsulation layer in the first display area AA1.

Embodiments of the present application further provide a display device, which includes the display panel of any one of the embodiments above. Because the display device of embodiments of the present application includes the display panel mentioned above, the display device of embodiments of the present application has display effect of the display panel mentioned above, which is not repeated here. The display device may be, but be not limited to, electronic devices such as mobile phones and tablet computers.

The photosensitive elements may be image collection devices for collecting external image information. The photosensitive elements may not be limited to image collection devices. For example, in some embodiments, the photosensitive elements may be light sensors such as infrared sensors, proximity sensors, infrared lens, flood sensing elements, ambient light sensors, and dot matrix projectors.

Figure 9:
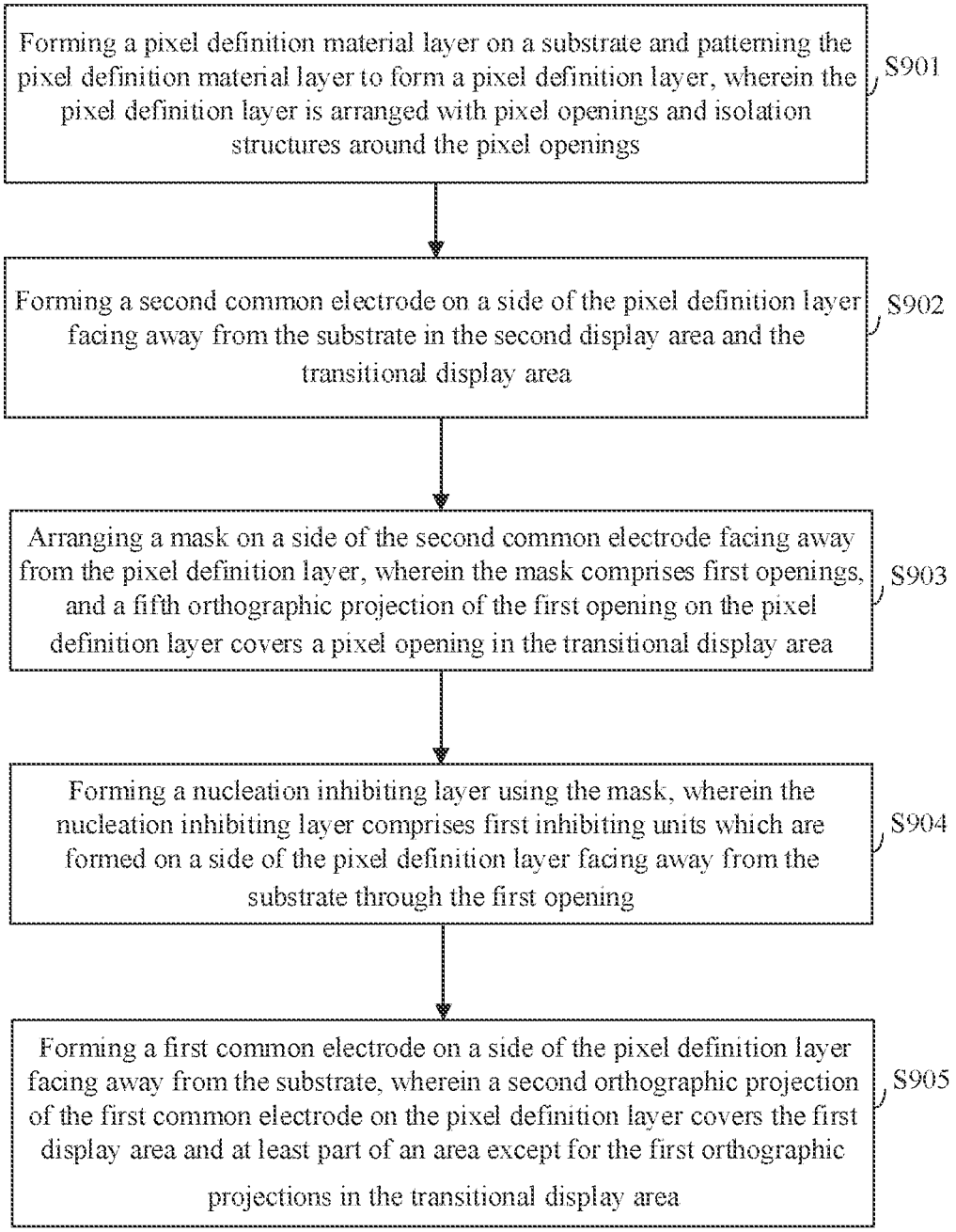
FIG. 9 illustrates a flowchart of a method for manufacturing a display panel according to an embodiment of the present application.

With reference to FIG. 9, embodiments of the present application provide a method for manufacturing a display panel, which can be the display panel mentioned above according to a first aspect. The display panel has a first display area AA1, a second display area AA2 and a transitional display area AA3. The transitional display area AA3 is located between the first display area AA1 and the second display area AA2. A light transmittance of the first display area AA1 is higher than a light transmittance of the second display area AA2. The method for manufacturing the display panel includes steps S901 to S905.

In step S901, a pixel definition material layer is formed on a substrate 101, the pixel definition material layer is patterned to form a pixel definition layer 100, and pixel openings 120 are arranged on the pixel definition layer 100 and isolation structures 110 are formed around the pixel openings 120.

In step S902, a second common electrode 500 is formed on a side of the pixel definition layer away from the substrate in the second display area AA2 and the transitional display area AA3.

In step S903, a mask is arranged on a side of the second common electrode 500 away from the pixel definition layer 100, wherein the mask has first openings overlapped with the pixel openings 120 in the transitional display area AA3.

In step S904, a nucleation inhibiting layer 200 is formed by the mask, wherein the nucleation inhibiting layer 200 includes first inhibiting units 210 which are on a side of the pixel definition layer 100 away from the substrate 101 through the first openings.

In step S905, a first common electrode 300 is formed on a side of the pixel definition layer 100 away from the substrate, second orthographic projection of the first common electrode 300 on the pixel definition layer 100 covers at least part of area except for first orthographic projections in the first display area AA1 and the transitional display area AA3.

According to the method of embodiments of the present application, orthographic projections of the first inhibiting units 210 on the pixel definition layer 100 cover pixel openings 120 in the transitional display area AA3. That is, the first inhibiting units 210 are formed on a side of the pixel openings 120 away from the substrate 101 in the transitional display area AA3. Second orthographic projection of the first common electrode 300 on the pixel definition layer 100 covers the first display area AA1 and area except for the first orthographic projections in the transitional display area AA3. That is, the first common electrode 300 is not formed on a side of pixel openings 120 away from the substrate 101 in the transitional display area AA3. Second common electrode 500 is formed in the first display area AA1 and the transitional display area AA3. Therefore, the second common electrode 500 is formed in the pixel openings 120 away from the substrate 101 in the transitional display area AA3. The second common electrode 500 is formed on a side of the pixel openings 120 away from the substrate 101 in the transitional display area AA3 while no first common electrode 300 is formed. This can avoid display stripes formed by stacking of the first common electrode 300 and the second common electrode 500 in the pixel openings 120 in the transitional display area AA3 and further improve display effect of the display panel. Therefore, the display panel of embodiments of the present application can not only realize under-screen integration of photosensitive elements, but also improve display effect of the display panel.

In other optional embodiments, the nucleation inhibiting layer 200 further includes second inhibiting units 220. In this case, in step S903, the mask further includes second openings. Orthographic projections of the second openings on the pixel definition layer 100 cover at least part of the isolation structures 110 in the transitional display area AA3. In step S904, the nucleation inhibiting layer 200 further includes the second inhibiting units 220 formed in the second openings. Third orthographic projections of the second inhibiting units 220 on the pixel layer 100 cover at least part of isolation structures 110 in the transitional display area AA3. In step S905, the second orthographic projection of the first common electrode 300 on the pixel definition layer 100 covers at least part of area except for the first inhibiting units 210 and the second inhibiting units 220. Arranging the second inhibiting units 220 can increase light transmittance of the transitional display area AA3, reducing display stripes between the first display area AA1 and the second display area AA2.

In some optional embodiments, the nucleation inhibiting layer 200 further includes third inhibiting units 230. In this case, in step S903, the mask further includes third openings. The third openings are overlapped with at least a part of isolation structures 110 in the first display area AA1. In step S904, the nucleation inhibiting layer 200 includes third inhibiting units 230. Fourth orthographic projections of the third inhibiting units 230 on the pixel definition layer 100 cover at least part of the isolation structures 110 in the first display area AA1. In step S905, orthographic projection of the first common electrode 300 covers at least part of area except for the first orthographic projections and the fourth orthographic projections on the pixel definition layer 100. By arranging the third inhibiting units 230, light transmittance in the first display area AA3 can be increased.

What is claimed is:

1. A display panel including a first display area, a second display area with a light transmittance less than a light transmittance of the first display area, and a transitional display area located between the first display area and the second display area, comprising:
   a substrate;
   a pixel definition layer located on the substrate, wherein the pixel definition layer comprises a plurality of pixel openings and a plurality of isolation structures formed around the pixel openings;
   a nucleation inhibiting layer located on a side of the pixel definition layer away from the substrate, wherein the nucleation inhibiting layer comprises a plurality of first inhibiting units, and a first orthographic projection of each of the first inhibiting units on the pixel definition layer covers corresponding one of the pixel openings in the transitional display area; and
   a plurality of common electrodes located on a side of the pixel definition layer away from the substrate, wherein the common electrodes comprise a first common electrode and a second common electrode formed in the second display area and the transitional display area, the second common electrode is located on a side of the first inhibiting units close to the pixel definition layer in the transitional display area, and a second orthographic projection of the first common electrode on the pixel definition layer covers the first display area and at least part of an area except for the first orthographic projections in the transitional display area.

2. The display panel of claim 1, wherein the nucleation inhibiting layer further includes second inhibiting units, and a third orthographic projection of one of the second inhibiting units on the pixel definition layer covers at least part of corresponding one of the isolation structures in the transitional display area, the second orthographic projection covers at least part of an area except for the first orthographic projections and the third orthographic projections on the pixel definition layer.

3. The display panel of claim 2, wherein at least part of the first common electrode is stacked with the second common electrode in the transitional display area.

4. The display panel of claim 3, wherein the first common electrode is located on a side of the second common electrode away from the pixel definition layer.

5. The display panel of claim 2, wherein at least part of the second inhibiting unit is stacked with the second common electrode in the transitional display area, and the second common electrode is located on a side of the second inhibiting units close to the pixel definition layer.

6. The display panel of claim 2, wherein the nucleation inhibiting layer further includes a plurality of third inhibiting units, and a fourth orthographic projection of a corresponding third inhibiting unit of the third inhibiting units on the pixel definition layer covers at least part of corresponding one of the isolation structures in the first display area, and at least some of the third inhibiting units are arranged discontinuously with each other, and the second orthographic projection covers at least part of an area except for the fourth orthographic projections on the pixel definition layer in the first display area.

7. The display panel of claim 6, wherein the first common electrode includes a body and a plurality of first hollows through the body, the first hollows are disposed in the transitional display area and each of the first hollows is overlapped with at least part of corresponding one of the pixel openings in a thickness direction of the display panel, and the first inhibiting units are located in the first hollows.

8. The display panel of claim 7, wherein the first common electrode further includes second hollows through the body, and the second inhibiting units are located in the second hollows.

9. The display panel of claim 8, wherein the first common electrode further includes third hollows through the body, and the third inhibiting units are located in the third hollows.

10. The display panel according to claim 1, wherein a material of the first common electrode comprises magnesium weighted greater than or equal to 95% of the first common electrode.

11. The display panel of claim 10, wherein the second common electrode comprises a magnesium-silver alloy layer.

12. The display panel of claim 11, wherein in the material of the magnesium-silver alloy layer, a weight ratio of magnesium to silver ranges from 1/15 to 1/9.

13. The display panel of claim 1, wherein a minimum width of the transitional display area ranges from 10 μm to 100 μm.

14. The display panel of claim 1, wherein a thickness of the nucleation inhibiting layers ranges from 10 Å to 100 Å.

15. A display device, comprising the display panel according to claim 1.

* * * * *